(12) United States Patent
Jin et al.

(10) Patent No.: US 7,933,143 B2
(45) Date of Patent: Apr. 26, 2011

(54) CAPACITORLESS DRAM AND METHODS OF OPERATING THE SAME

(75) Inventors: Young-gu Jin, Hwaseong-si (KR); Ki-ha Hong, Seoul (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 385 days.

(21) Appl. No.: 12/010,482

(22) Filed: Jan. 25, 2008

(65) Prior Publication Data

US 2009/0026519 A1    Jan. 29, 2009

(30) Foreign Application Priority Data

Jul. 27, 2007   (KR) .................. 10-2007-0075909

(51) Int. Cl.
*G11C 11/24* (2006.01)

(52) U.S. Cl. .................. 365/150; 257/401; 257/E29.274

(58) Field of Classification Search .................. 257/401, 257/E29.274; 365/148, 189.011, 150
See application file for complete search history.

(56) References Cited

U.S. PATENT DOCUMENTS

| 7,317,641 | B2* | 1/2008 | Scheuerlein | 365/189.011 |
| 7,514,746 | B2* | 4/2009 | Tang et al. | 257/347 |
| 2004/0042268 | A1* | 3/2004 | Bhattacharyya | 365/185.08 |
| 2005/0062088 | A1* | 3/2005 | Houston | 257/296 |
| 2005/0280028 | A1* | 12/2005 | Fazan et al. | 257/192 |
| 2009/0016118 | A1* | 1/2009 | Widjaja et al. | 365/185.26 |

* cited by examiner

*Primary Examiner* — Jerome Jackson, Jr.
*Assistant Examiner* — Paul A Budd
(74) *Attorney, Agent, or Firm* — Harness, Dickey & Pierce, P.L.C.

(57) ABSTRACT

A capacitorless DRAM and methods of manufacturing and operating the same are provided. The capacitorless DRAM includes a source, a drain and a channel layer, formed on a substrate. A charge reserving layer is formed on the channel layer. The capacitorless DRAM includes a gate that contacts the channel layer and the charge reserving layer.

10 Claims, 13 Drawing Sheets

U.S. 7,933,143 B2

CAPACITORLESS DRAM AND METHODS OF OPERATING THE SAME

PRIORITY STATEMENT

This application claims the benefit of priority under 35 U.S.C. §119 from Korean Patent Application No. 10-2007-0075909, filed on Jul. 27, 2007 in the Korean Intellectual Property Office, the disclosure of which is incorporated herein in its entirety by reference.

BACKGROUND

1. Field

Example embodiments relate to a semiconductor device and methods of manufacturing and operating the same. Other example embodiments relate to a capacitorless DRAM and methods of manufacturing and operating the same.

2. Description of the Related Art

A memory cell of a conventional dynamic random access memory (DRAM) has a 1T/1C structure (i.e., one transistor and one capacitor). It may be difficult to decrease a cell area of a conventional DRAM that includes both a transistor and a capacitor.

In order to scale down conventional DRAMs, a DRAM that stores data with a transistor and without a capacitor (e.g., a capacitorless 1T DRAM) has been disclosed. A conventional capacitorless 1T DRAM may have an electrically floated channel.

FIGS. 1A and 1B are diagrams illustrating cross-sectional views of a conventional capacitorless 1T DRAM.

Referring to FIGS. 1A and 1B, a gate 110 may be formed on a silicon on insulator (SOI) substrate 100. The SOI substrate 100 may have a structure in which a first silicon layer 10, an oxide layer 20 and a second silicon layer 30 are sequentially stacked. The gate 110 may have a structure in which a gate insulating layer 40 and a gate conductive layer 50 are sequentially stacked. A source 30a and a drain 30b may be formed in the second silicon layer 30 on both sides of the gate 110. A floating channel body 30c, which is electrically separated from the first silicon layer 10, may be located (or formed) in the second silicon layer 30 between the source 30a and the drain 30b.

As depicted in FIG. 1A, if 0.6V, 0V, and 2.3V are respectively applied to the gate conductive layer 50, the source 30a and the drain 30b, then electrons migrate from the source 30a to the drain 30b through the floating channel body 30c. Electron-hole pairs may be generated in the floating channel body 30c due to electron impact. The generated holes accumulate in the floating channel body 30c and cannot migrate to the outside. The holes generated in this manner are referred to as excess holes 5. The state in which the excess holes 5 accumulate in the floating channel body 30c is referred to as a first state.

As depicted in FIG. 1B, if 0.6V, 0V, and −2.3V are respectively applied to the gate conductive layer 50, the source 30a and the drain 30b, then a forward bias is applied between the floating channel body 30c and the drain 30b. The excess holes 5 may be removed (or migrate) from the floating channel body 30c and excess electrons 7 may accumulate in the floating channel body 30c. The state in which the excess electrons 7 accumulate in the floating channel body 30c is referred to as a second state.

Because the electrical resistances in the first and second states of the floating channel body 30c differ from each other, the first and second states can correspond to data values '1' and '0', respectively.

In the conventional capacitorless 1T DRAM, the data retention characteristic in the floating channel body 30c may not be acceptable. In the conventional capacitorless 1T DRAM, because a substantially large area of the floating channel body 30c contacts the source 30a and the drain 30b, a large number of charges may leak at junction areas therebetween. As such, data retention time in the floating channel body 30c may decrease.

If the length of the floating channel body 30c is reduced in order to scale down the conventional capacitorless 1T DRAM, the doping concentration in the floating channel body 30c must be increased to secure a threshold voltage. As the junction leakage current between the floating channel body 30c and the source 30a and the drain 30b increases, the data retention characteristic decreases.

The conventional capacitorless 1T DRAM may be a planar type device. If the length of the floating channel body 30c is reduced below a critical value, interference between the source 30a and the drain 30b (i.e., a short channel effect) may occur. The operating characteristics of the device may be degraded. As such, it may be difficult to scale down a conventional capacitorless 1T DRAM.

SUMMARY

Example embodiments relate to a semiconductor device and methods of manufacturing and operating the same. Other example embodiments relate to a capacitorless DRAM and methods of manufacturing and operating the same.

Example embodiments relate to a capacitorless DRAM with increased data retention characteristics and a decreased short channel effect and methods of manufacturing and operating the same.

According to example embodiment, there is provided a capacitorless DRAM including a substrate having a source, a drain and a channel layer. A charge reserving layer may be formed on the channel layer. The DRAM may include a gate that contacts the channel layer and the charge reserving layer.

The channel layer may protrude higher than the source and the drain. The charge reserving layer may be separated from the source and the drain.

The gate may be formed on two opposing sides of an upper portion of the channel layer, on two opposing sides of the charge reserving layer and an upper surface of the charge reserving layer. An insulating layer may be formed on two opposing sides of a lower part of the channel layer.

The gate may be formed on two opposing sides of the channel layer, two opposing sides of the charge reserving layer and an upper surface of the charge reserving layer.

The charge reserving layer may have a valence band higher than that of the channel layer. The channel layer may be an intrinsic semiconductor layer or a p-type semiconductor layer. The charge reserving layer may be a p-type semiconductor layer or a compound semiconductor layer. The compound semiconductor layer may be a silicon germanium (SiGe) layer.

The substrate may include an insulating layer and a semiconductor layer formed on the insulating layer. The semiconductor layer may include the source, the drain and the channel layer. The substrate may be a silicon-on-insulator (SOI) substrate.

According to example embodiments, there is provided a method of manufacturing a capacitorless DRAM including preparing a base substrate having a semiconductor pattern layer on an upper surface thereof; forming a gate material layer covering the semiconductor pattern layer on the base substrate; exposing sides of the semiconductor pattern layer by patterning the gate material layer; removing a portion of each exposed side of the semiconductor pattern layer and forming a source and a drain in remaining portions of the exposed sides of the semiconductor pattern layer. An upper portion of the semiconductor pattern layer may be a charge reserving layer.

A channel layer formed between the source and the drain may protrude higher than the source and the drain. The charge reserving layer may be separated from the source and the drain. The charge reserving layer may have a valence band higher than that of the channel layer that located between the source and the drain. The channel layer may be an intrinsic semiconductor layer or a p-type semiconductor layer. The charge reserving layer may be a p-type semiconductor layer or a compound semiconductor layer. The compound semiconductor layer may be a silicon germanium (SiGe) layer.

Preparing the base substrate having the semiconductor pattern layer may include preparing a substrate having an insulating layer and a semiconductor layer on the insulating layer; transforming an upper portion of the semiconductor layer into the charge reserving layer (or forming the charge reserving layer on the upper portion of the semiconductor layer) and patterning the charge reserving layer and the semiconductor layer.

The charge reserving layer may be formed by ionic injecting a p-type dopant into the upper portion of the semiconductor layer.

Ge ions may be injected into the upper portion of the semiconductor layer. The semiconductor layer may be a silicon layer. The charge reserving layer may be formed by annealing the semiconductor layer having the injected Ge ions.

The substrate may be a silicon-on-insulator (SOI) substrate.

Patterning the charge reserving layer and the semiconductor layer may include forming a mask layer on the charge reserving layer; etching the charge reserving layer on sides of the mask layer and portions of the semiconductor layer (under the charge reserving layer) on the sides of the mask layer and removing the mask layer.

The method may include oxidizing the portions of the semiconductor layer remaining on the sides of the mask layer, after etching the portions of the semiconductor layer and prior to removal of the mask layer.

Patterning the charge reserving layer and the semiconductor layer may include forming a mask layer on the charge reserving layer; etching the charge reserving layer and the semiconductor layer on the sides of the mask layer until the insulating layer is exposed and removing the mask layer.

Preparing the base substrate having the semiconductor pattern layer may include preparing a substrate having an insulating layer and a silicon layer on the insulating layer; forming the charge reserving layer on the silicon layer, wherein the charge reserving layer is formed of SiGe; and patterning the charge reserving layer and the silicon layer. The substrate may be a SOI substrate.

Patterning the charge reserving layer and the silicon layer may include forming a mask layer on the charge reserving layer; etching the charge reserving layer on sides of the mask layer and portions of the silicon layer (under the charge reserving layer) on the sides of the mask layer and removing the mask layer.

The method may include oxidizing the portions of the silicon layer remaining on the sides of the mask layer, after etching the portions of the silicon layer and prior to removal of the mask layer.

Patterning the charge reserving layer and the silicon layer may include forming a mask layer on the charge reserving layer; etching the charge reserving layer and the silicon layer on sides of the mask layer until the insulating layer is exposed and removing the mask layer.

According to example embodiments, there is provided a method of operating a semiconductor device including preparing a capacitorless DRAM as described in the example embodiments discussed above; and applying a voltage to each of the source, the drain and the gate. The voltage may be one selected from a group consisting of a data writing voltage, a data reading voltage and a data erasing voltage.

BRIEF DESCRIPTION OF THE DRAWINGS

Example embodiments will be more clearly understood from the following detailed description taken in conjunction with the accompanying drawings. FIGS. 1A-8H represent non-limiting, example embodiments as described herein.

FIGS. 1A and 1B are diagrams illustrating cross-sectional views of a conventional capacitorless DRAM;

FIG. 2 is a diagram illustrating a perspective view of a capacitorless DRAM according to example embodiments;

FIG. 3 is a diagram illustrating a cross-sectional view taken along line I-I' of FIG. 2;

FIG. 4 is a diagram illustrating a cross-sectional view taken along line II-II' of FIG. 2;

FIG. 5 is a diagram illustrating a perspective view of a capacitorless DRAM according to example embodiments;

FIGS. 6 and 7 are graphs showing current-voltage characteristics of a capacitorless DRAM according to example embodiments; and FIGS. 8A through 8H are diagrams illustrating perspective views of a method of manufacturing a capacitorless DRAM according to example embodiments.

DETAILED DESCRIPTION OF EXAMPLE EMBODIMENTS

Figure 1A:
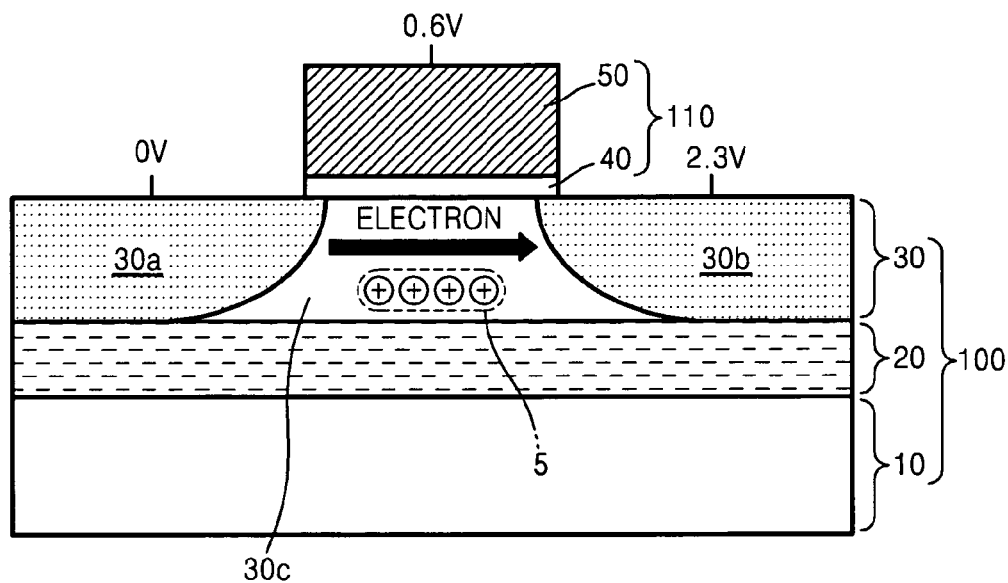
Figure 1B:
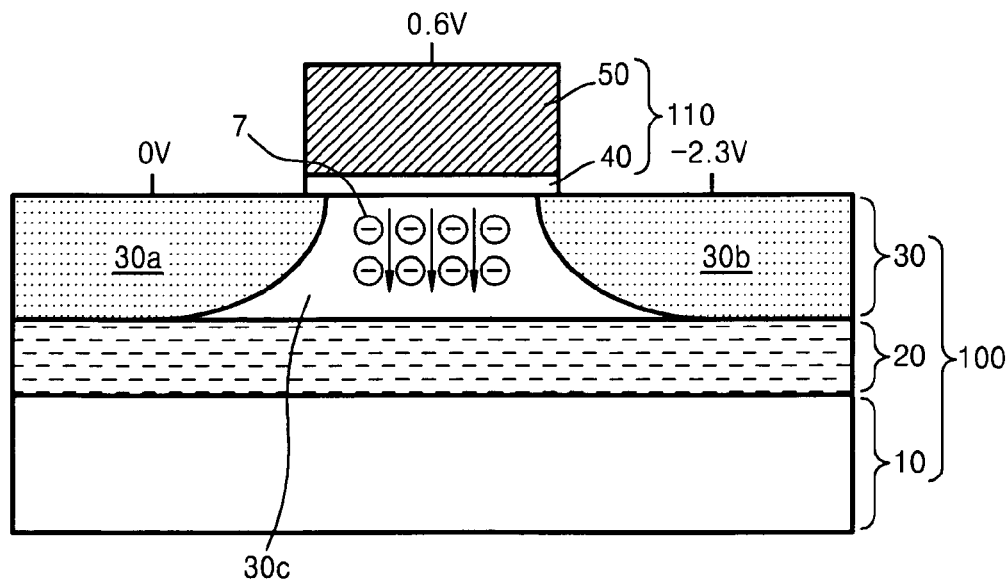

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device and methods of manufacturing and operating the same. Other example embodiments relate to a capacitorless DRAM and methods of manufacturing and operating the same.

Figure 2:
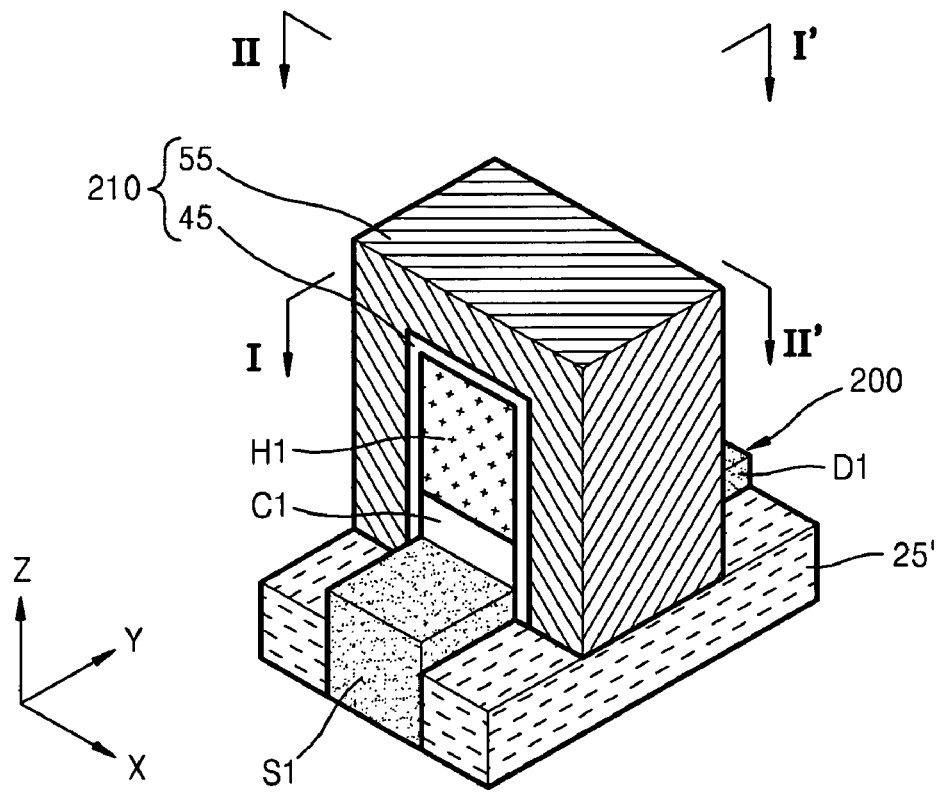
Figure 3:
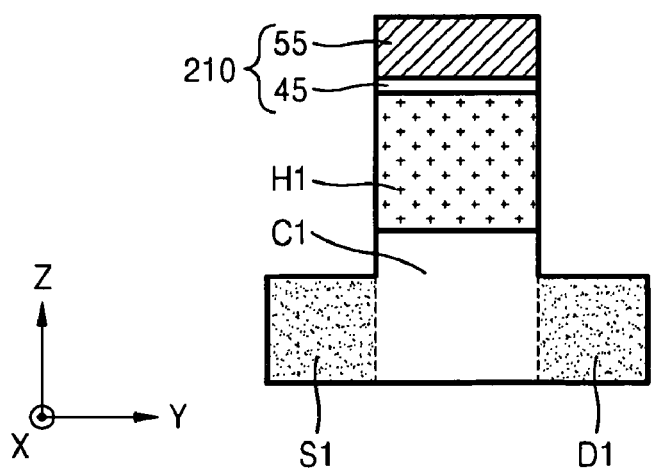
Figure 4:
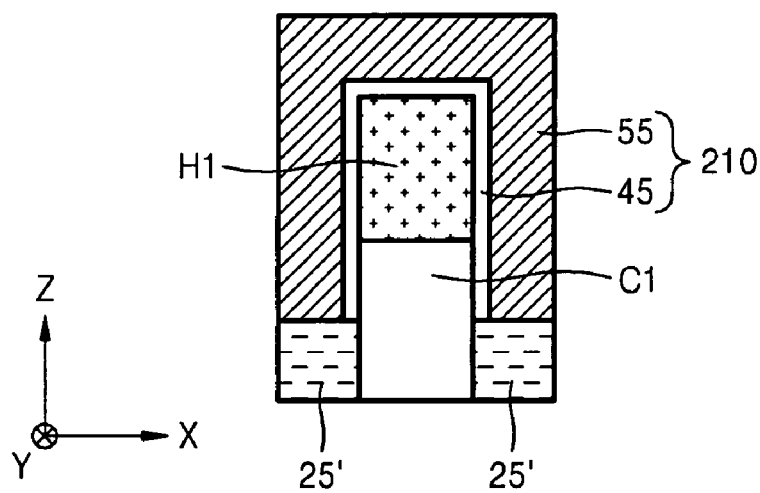

FIG. 2 is a diagram illustrating a perspective view of a capacitorless DRAM according to example embodiments. FIG. 3 is a diagram illustrating a cross-sectional view taken along line I-I' of FIG. 2. FIG. 4 is a diagram illustrating a cross-sectional view taken along line II-II' of FIG. 2.

Referring to FIGS. 2 through 4, the capacitorless DRAM according to example embodiments includes a substrate 200. A source S1 and a drain D1 separated from each other may be included in the substrate 200. The source S1 and the drain D1 may be an n+ semiconductor layer (e.g., an n+ silicon layer). A channel layer C1 may be formed between the source S1 and the drain D1.

The channel layer C1 may protrude higher than the source S1 and the drain D1 in a Z-axis direction. A height difference between the channel layer C1 and the source S1 may be approximately 20 nm. Because the channel layer C1 protrudes higher than the source S1 and the drain D1, an effective channel length (which is a path for moving charges) may be increased. As such, a short channel effect (or characteristic) of the capacitorless DRAM according to example embodiments may decrease.

A charge reserving layer H1 may be formed on the channel layer C1. The charge reserving layer H1 may be separated from the source S1 and the drain D1 because the channel layer C1 protrudes higher than the source S1 and the drain D1.

The charge reserving layer H1 may include a material having a valence band higher than that of the channel layer C1. For example, the channel layer C1 may be an intrinsic semiconductor layer or a p-type semiconductor layer. The charge reserving layer H1 may be a p-type semiconductor layer (e.g., a p+ semiconductor layer) or a compound semiconductor layer (e.g., a SiGe layer).

Because the charge reserving layer H1 has a valence band higher than the channel layer C1, holes may accumulate in the charge reserving layer H1. If the volume of the charge reserving layer H1 is increased by increasing the height of the charge reserving layer H1, the storage capacity of the charge reserving layer H1 and the data retention time in the charge reserving layer H1 may increase.

Because a SiGe layer has a valence band higher than that of a p+ semiconductor layer, use of a SiGe layer as the charge reserving layer H1 may contribute to an increase in the data retention time.

Degradation of the data retention time characteristic due to junction leakage current may be prevented (or reduced) because the charge reserving layer H1 is separated from the source S1 and the drain D1. The data retention time characteristic of the capacitorless DRAM according to example embodiments may increase.

A gate 210 that contacts the channel layer C1 and the charge reserving layer H1 may be formed on the substrate 200. The gate 210 may have a structure in which a gate insulating layer 45 and a gate conductive layer 55 may be sequentially stacked. The gate 210 may be formed on upper portion of two opposing side surfaces of the channel layer C1, two opposing side surfaces and an upper surface of the charge reserving layer H1. Both side surfaces of the channel layer C1 and the charge reserving layer H1 may be parallel to a Y-Z plane.

An insulating layer 25' may be formed on a lower portion of the channel layer C1 below the gate 210. The insulating layer 25' may extend parallel to the source S1 and the drain D1. The gate 210 may have various shapes so long as the gate 210 contacts a portion of the channel layer C1 and the charge reserving layer H1.

Figure 5:
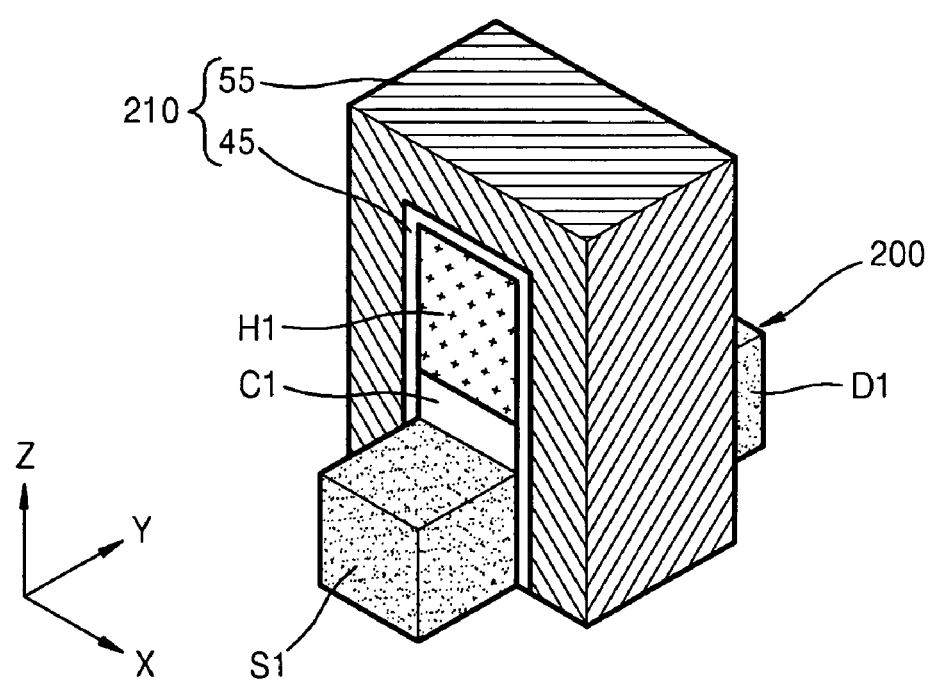

FIG. 5 is a diagram illustrating a perspective view of a capacitorless DRAM according to example embodiments.

Referring to FIG. 5, the gate 210 may be extended to a lower part of the channel layer C1. As such, the insulating layer 25' may not be necessary.

Although not clearly shown in FIGS. 2 and 5, the substrate 200 may include an insulating layer and a semiconductor layer formed on the insulating layer. The source S1, the drain D1 and the channel layer C1 may be formed in the semiconductor layer. The semiconductor layer may be a silicon layer. The substrate 200 may be a silicon on insulator (SOI) substrate.

Data recording and erasing operations using a capacitorless DRAM having the above structure according to example embodiments are performed by accumulating excess holes in the charge reserving layer H1 or by removing the excess holes accumulated in the charge reserving layer H1.

The method of accumulating excess holes in the charge reserving layer H1 may be divided into first and second mechanisms. The first mechanism is the generation of electron-hole pairs due to electron impact. The second mechanism is the generation of holes by electron tunnelling.

The state in which excess holes are accumulated in the charge reserving layer H1 is a state in which a data value of "1" is recorded. The state in which the excess holes are removed from the charge reserving layer H1 (or if electrons are excessively present in the charge reserving layer H1) is a state in which a data value of "0" is recorded.

Electrical resistance of the channel layer C1 varies according to the data recorded in the charge reserving layer H1. The data recorded in the charge reserving layer H1 may be read by measuring the electrical resistance of the channel layer C1.

Figure 6:
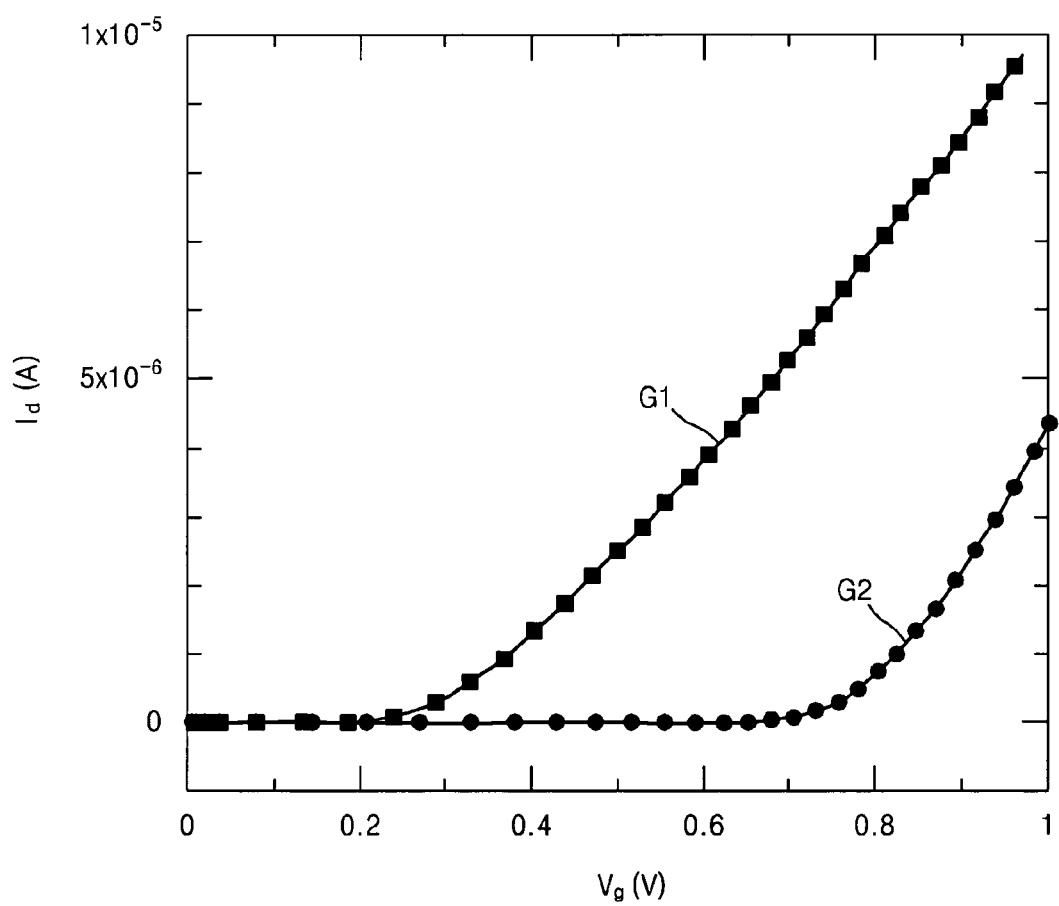

FIG. 6 is a graph showing current voltage (I-V) characteristics of a capacitorless DRAM according to example embodiments. In FIG. 6, the horizontal axis indicates a gate voltage $V_g$ applied to the gate and the vertical axis indicates drain current $I_d$.

In FIG. 6, first curve G1 and second curve G2 represent results obtained through an experiment performed using the capacitorless DRAM of FIG. 2. In the experiment, the thickness and height of the channel layer in an X-axis direction and a Z-axis direction were 63 nm and 40 nm, respectively. The thickness of the charge reserving layer in the Z-axis direction was 60 nm.

The first curve G1 indicates a state in which excess holes are accumulated in the charge reserving layer (i.e., a data value '1' is recorded (a '1' state)). The second curve G2 indicates a state in which excess holes are removed from the charge reserving layer (i.e., a data value '0' is recorded (a '0' state)).

In order to set the charge reserving layer H1 to the '1' state, a gate voltage $V_g$ of −2.5V, a drain voltage $V_d$ (i.e., a voltage applied to the drain) of 1.0V and a source voltage $V_s$ (i.e., a voltage applied to the source) of 0V may be applied. This writing operation may use the second mechanism.

In order to set the charge reserving layer H1 to the '1' state using the first mechanism described above, a gate voltage $V_g$ of 1.0V, a drain voltage $V_d$ of 3.0V and a source voltage $V_s$ of 0V may be applied.

In order to set the charge reserving layer H1 to the '0' state, a gate voltage $V_g$ of −1.0V, a drain voltage $V_d$ of −1.0V and a source voltage $V_s$ of 0V may be applied.

By setting the charge reserving layer H1 to the '0' state, holes accumulated in the charge reserving layer H1 may be removed by forcibly reducing the valence band of the charge reserving layer H1.

A capacitorless DRAM according to example embodiments stores holes of in a higher concentration than a conventional capacitorless DRAM even in a neutral state. If the charge reserving layer H1 is set to the '0' state, the '0' state may be strengthened (or increased) by depleting the excess holes and holes originally stored in the charge reserving layer H1.

The variation in the drain current $I_d$ was measured by increasing the gate voltage $V_g$ from 0V to 1.0V.

Referring to FIG. 6, as the gate voltage $V_g$ increases above 0.25V, the difference of drain currents $I_d$ between the '1' state and the '0' state increases. If the gate voltage $V_g$ is 0.8V, the drain current $I_d$ difference between the '1' state and the '0' state is approximately 6.5 µA, securing a high sensing margin for reading operations. The drain voltage $V_d$ for reading operations may be maintained at approximately 0.2V.

Figure 7:
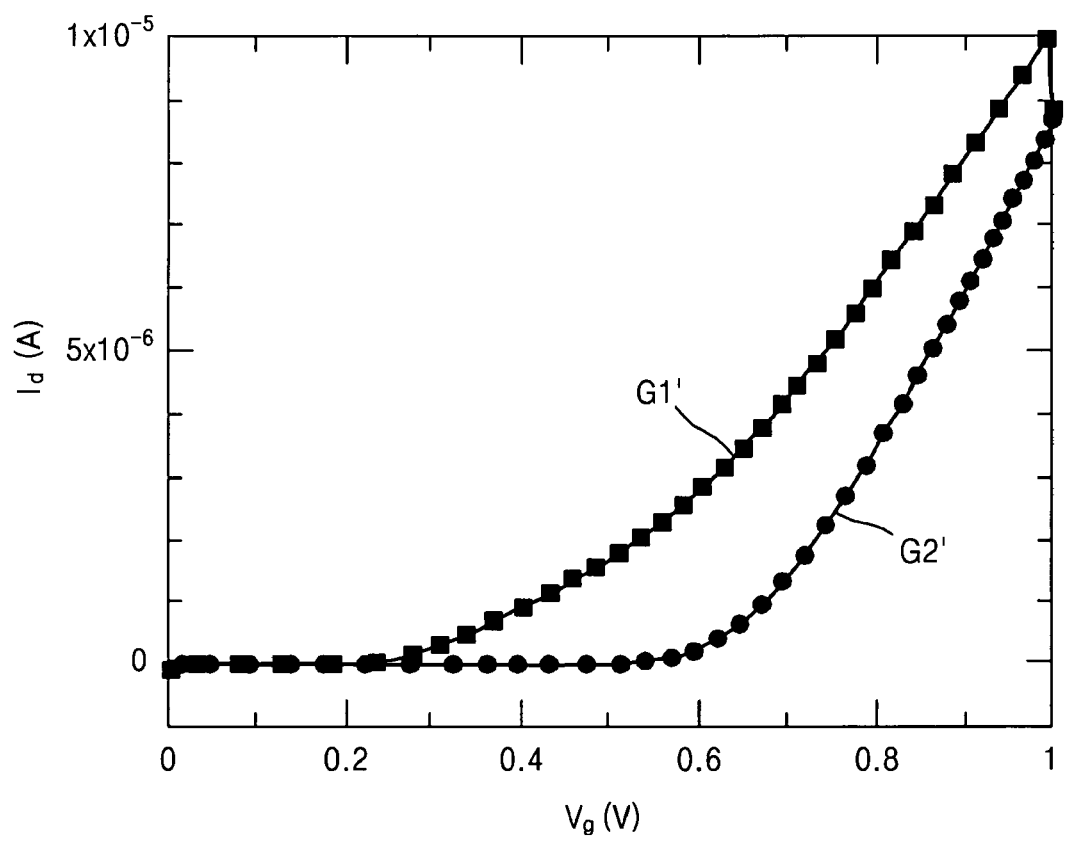

FIG. 7 is a graph showing current-voltage (I-V) characteristics of a capacitorless DRAM according to example embodiments.

The difference between the capacitorless DRAM of FIG. 6 and the capacitorless DRAM of FIG. 7 is the thickness of the channel layer. In the capacitorless DRAM used to obtain the results shown in FIG. 7, the thickness of the channel layer in an X-axis direction was 20 nm.

In FIG. 7, first curve G1' indicates an I-V characteristic in a state in which excess holes are accumulated in the charge reserving layer H1 (i.e., a '1' state) and second curve G2' indicates an I-V characteristic in a state in which excess holes in the charge reserving layer H1 are removed (i.e., a '0' state).

Referring to FIG. 7, although the thickness of the channel layer in the X-axis direction is 20 nm, if the gate voltage $V_g$ is approximately 0.6V, the drain current $I_d$ difference between the '1' state and the '0' state is approximately 2.5 µA, which indicates that a sensing margin for reading operations is secured. As such, the capacitorless DRAM according to example embodiments maintains higher writing/reading performance with a reduction in size.

Table 1 (below) summarizes gate voltages $V_g$, drain voltages $V_d$ and source voltages $V_s$ for setting the charge reserving layer H1 to the '1' state and the '0' state. In Table 1, "read" indicates voltages for reading the state of the charge reserving layer H1. Data erasing may be performed using the same principle of reasoning as data recording. For example, data '1' recorded in the charge reserving layer H1 may be removed by converting the state of the charge reserving layer H1 from the '1' state to the '0' state.

TABLE 1

| VOLTAGE | WRITE '1' | WRITE '0' | READ |
|---|---|---|---|
| $V_g$ | −2.5 | 1.0 | 0.8 |
| $V_d$ | 1.0 | 3.0 | −1.0 | 0.2 |
| $V_s$ | 0 | 0 | 0 | 0 |

FIGS. 8A through 8H are diagrams illustrating perspective views of a method of manufacturing a capacitorless DRAM according to example embodiments.

Figure 8A:
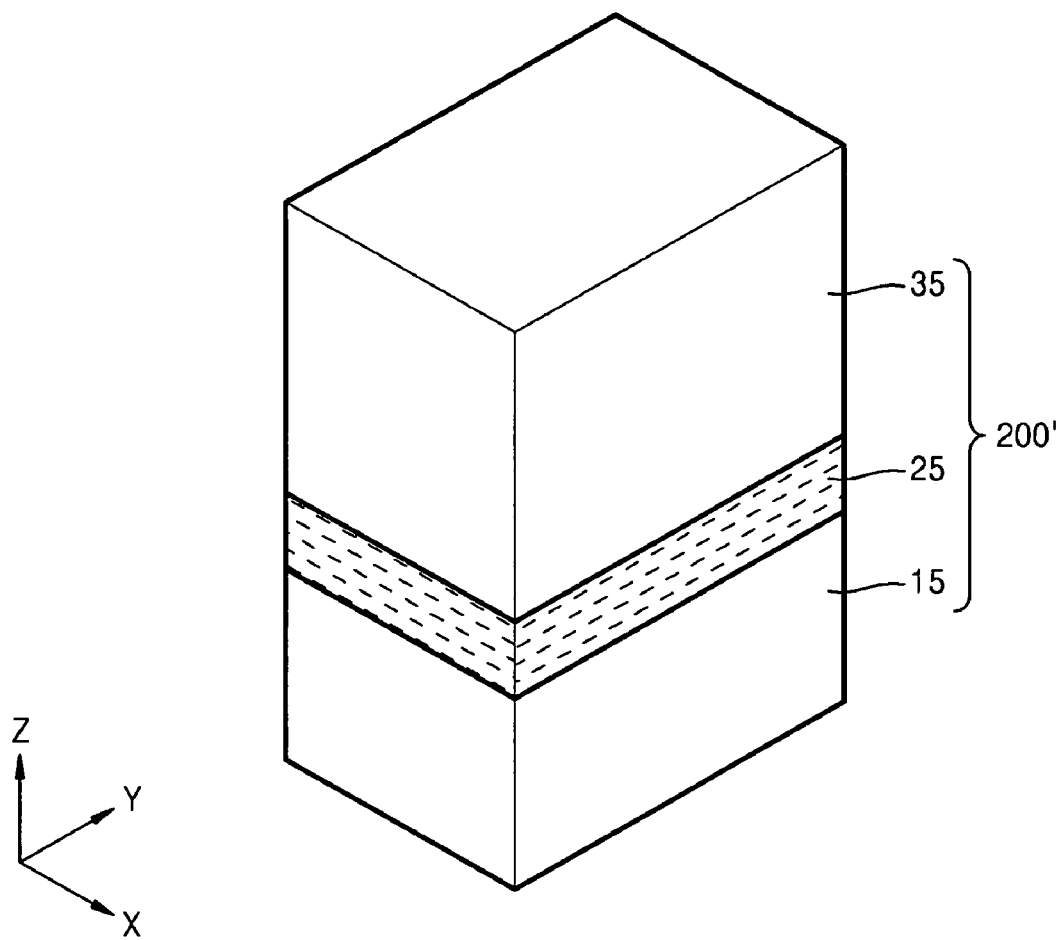

Referring to FIG. 8A, a SOI substrate 200' having a first silicon layer 15, a first oxide layer 25 and a second silicon layer 35 sequentially stacked may be prepared. The second silicon layer 35 may be an intrinsic silicon layer or a p-type silicon layer.

Figure 8B:
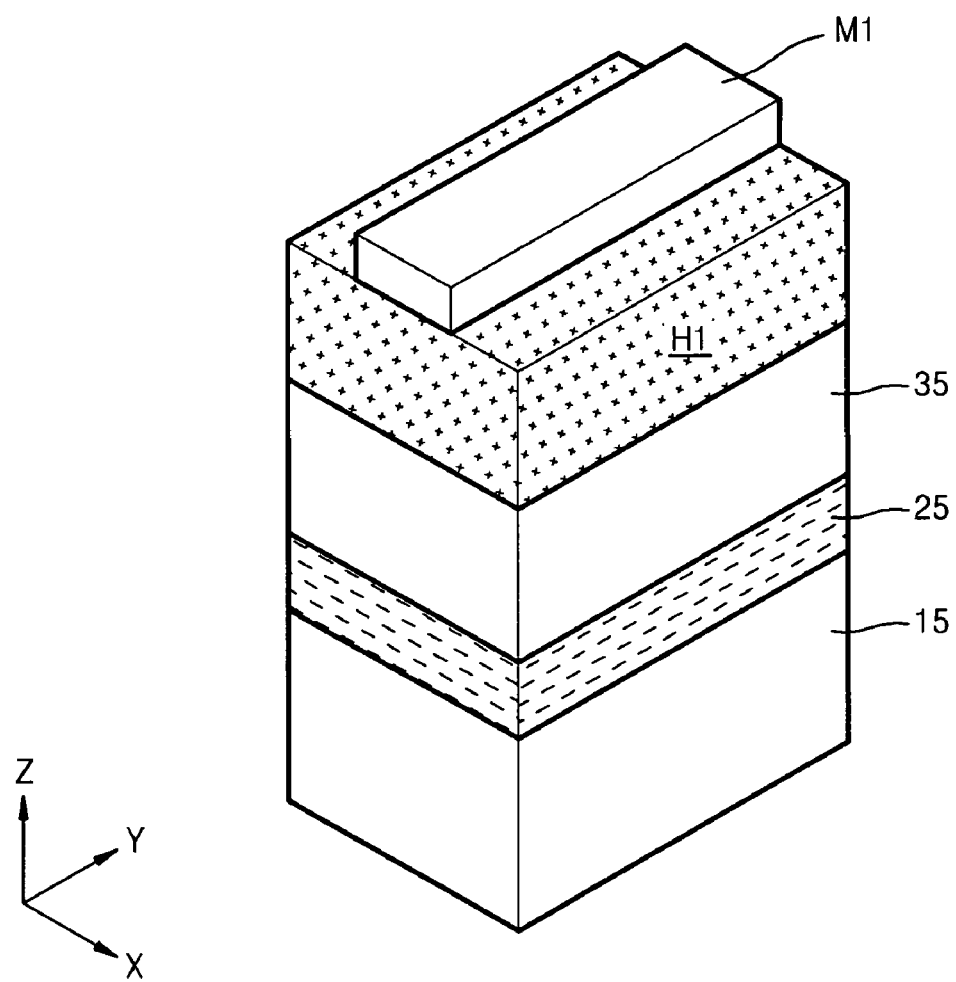

Referring to FIG. 8B, an upper portion of the second silicon layer 35 may be transformed to a charge reserving layer H1. The charge reserving layer H1 may be formed using various methods. For example, a charge reserving layer H1 formed of p+ silicon may be formed by highly doping a p-type dopant into the upper portion of the second silicon layer 35.

According to other example embodiments, a charge reserving layer H1 formed of SiGe may be formed by annealing the upper portion of the second silicon layer 35 to segregate germanium (Ge), after injecting Ge ions into the upper portion of the second silicon layer 35. Although not shown, instead of transforming the upper portion of the second silicon layer 35 to the charge reserving layer H1, the charge reserving layer H1 may be formed on the second silicon layer 35. For example, a SiGe layer may be formed on the second silicon layer 35 using an epitaxial growth method. The SiGe layer may be used as the charge reserving layer H1.

A first mask layer M1 may be formed on the charge reserving layer H1. Sides of the charge reserving layer H1 in an X-axis direction may be exposed by the first mask layer M1.

Figure 8C:
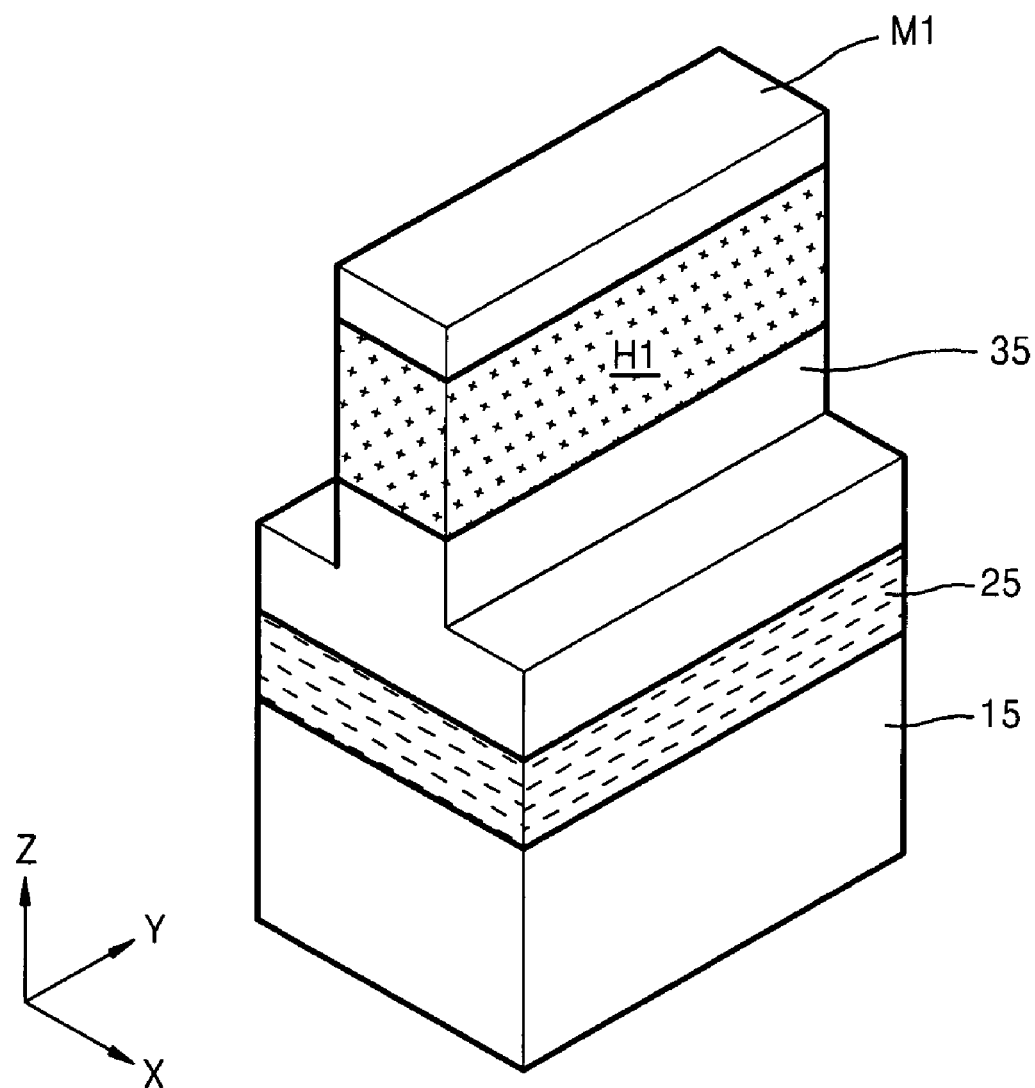

Referring to FIG. 8C, the charge reserving layer H1 on sides of the first mask layer M1 and portions of the second silicon layer 35 below the charge reserving layer H1 may be etched.

The second silicon layer 35 (having $O_2$ ions are injected thereto) may be oxidized by annealing, after injecting $O_2$ ions into the second silicon layer 35 on sides of the first mask layer M1 using the first mask layer M1 as an ion injection mask.

Figure 8D:
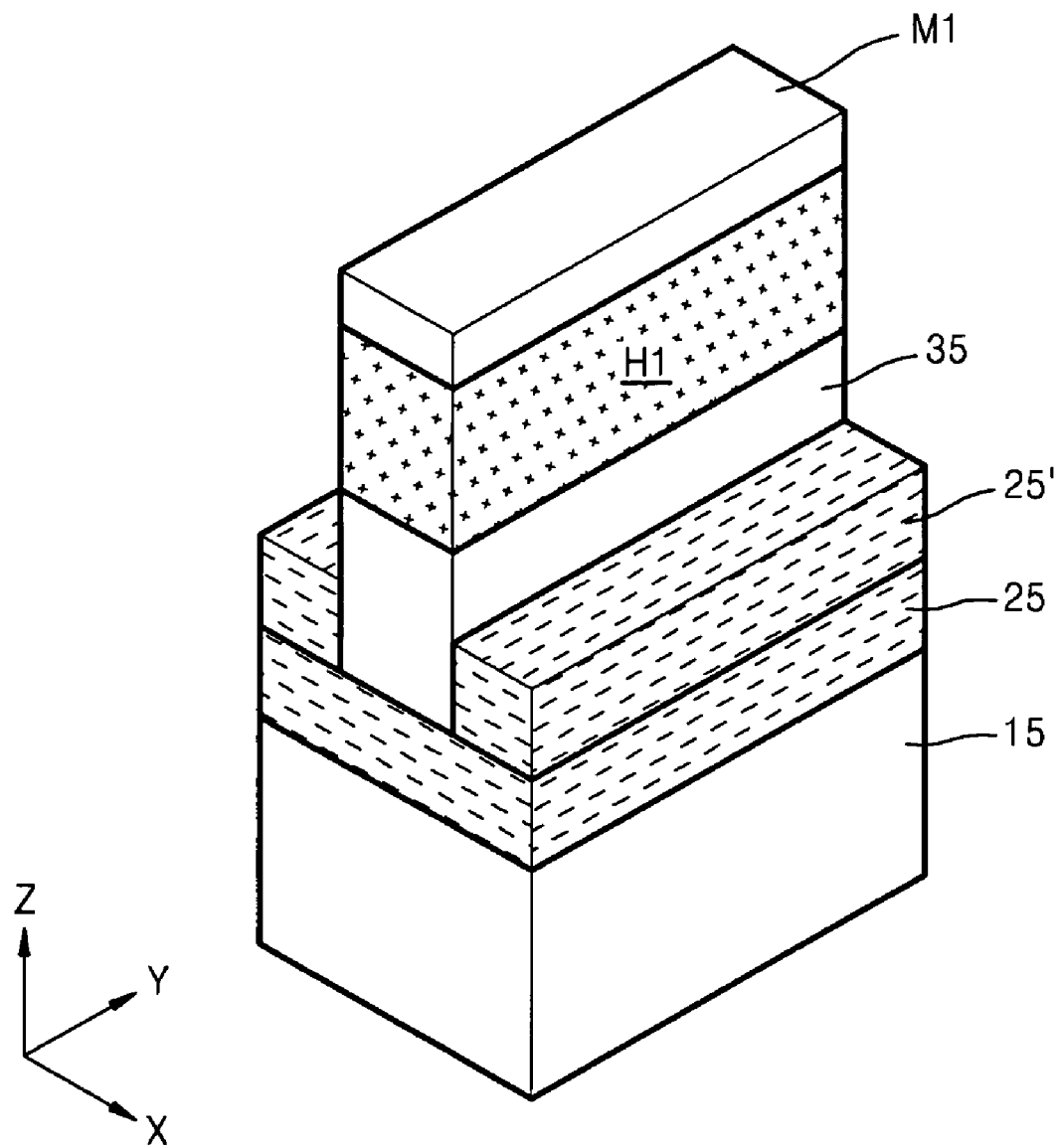

Referring to FIG. 8D, a second oxide layer 25' may be formed on the first oxide layer 25 on the sides of the first mask layer M1.

Figure 8E:
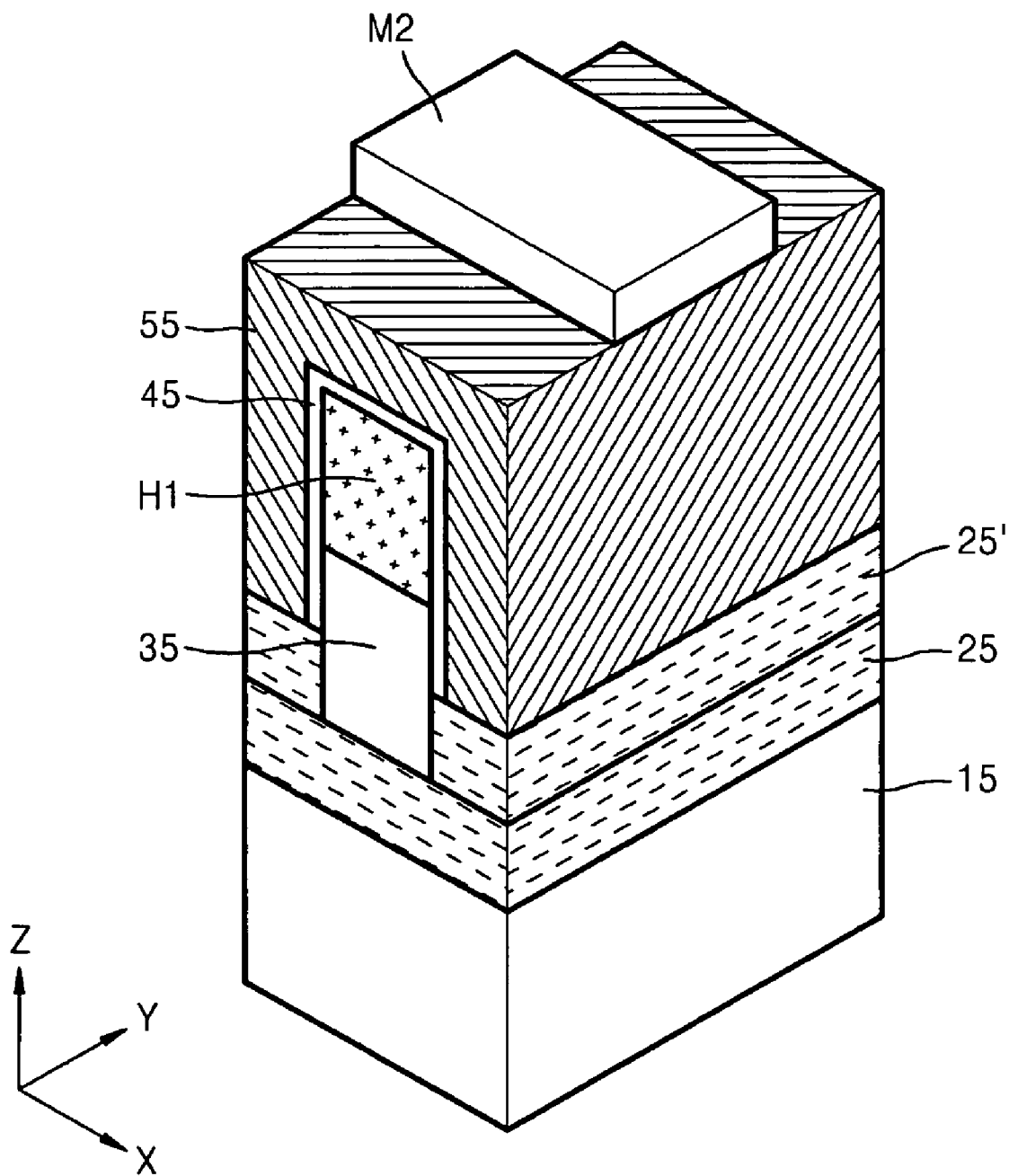

Referring to FIG. 8E, the first mask layer M1 may be removed. A gate insulating layer 45 may be formed on exposed surfaces of the charge reserving layer H1 and the second silicon layer 35. The gate insulating layer 45 may be formed of a silicon oxide using a thermal oxidation method or using a chemical vapor deposition (CVD) method.

A gate conductive layer 55 may be formed on the gate insulating layer 45 and the second oxide layer 25'. The gate insulating layer 45 and the gate conductive layer 55 may constitute a gate material layer having a two-layer structure.

A second mask layer M2 may be formed on the gate conductive layer 55. The second mask layer M2 may be line-shaped. The second mask layer M2 extends in the X-axis direction. The second mask layer M2 may cross the central region of the second silicon layer 35. The sides of the gate conductive layer 55 extending in a Y-axis direction may be exposed by the second mask layer M2.

Figure 8F:
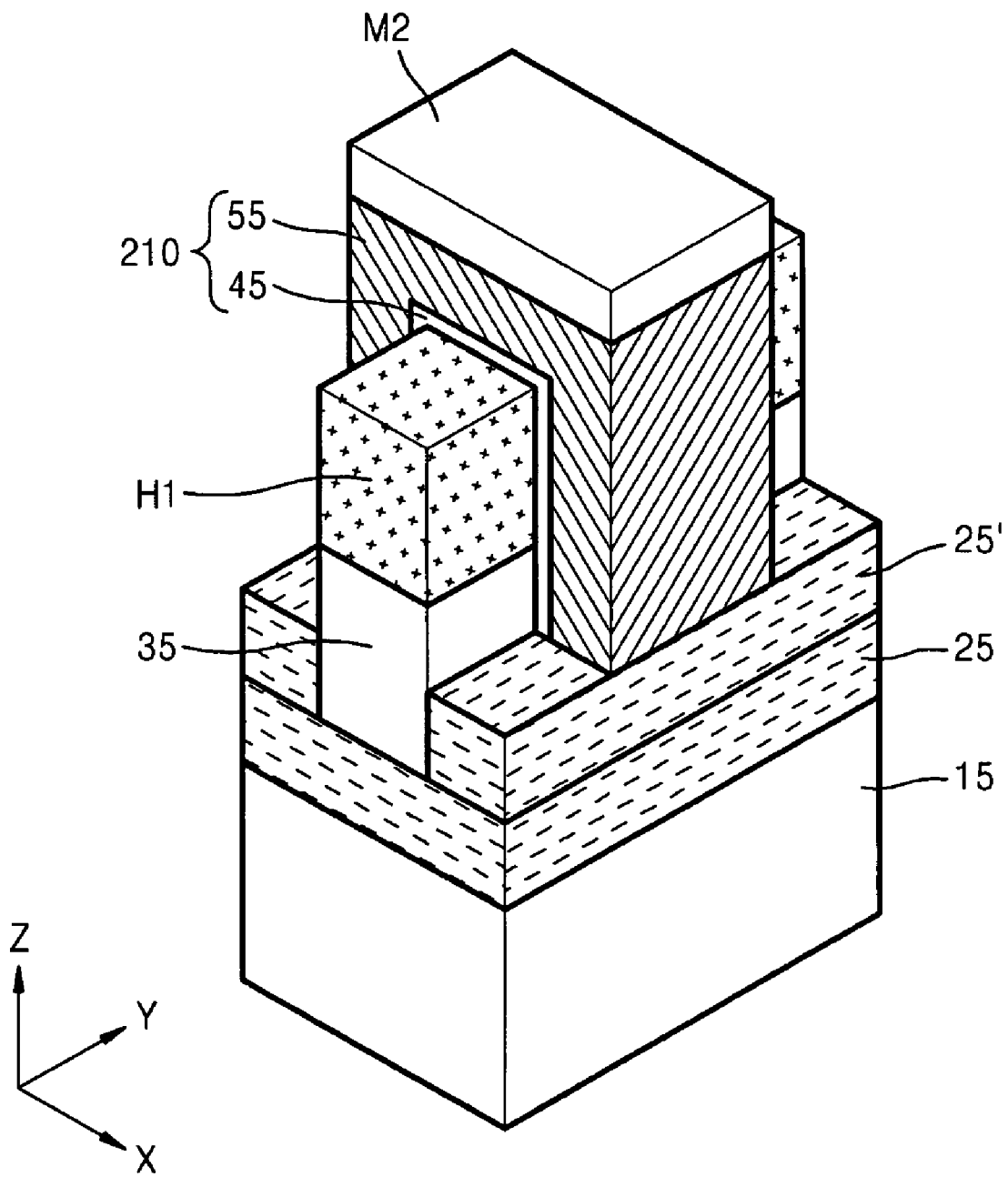

Referring to FIG. 8F, portions of the gate conductive layer 55 and the gate insulating layer 45 on the sides of the second mask layer M2 may be sequentially etched to form a gate 210 that includes the gate insulating layer 45 and the gate conductive layer 55. The etching may expose sides of the charge reserving layer H1.

Figure 8G:
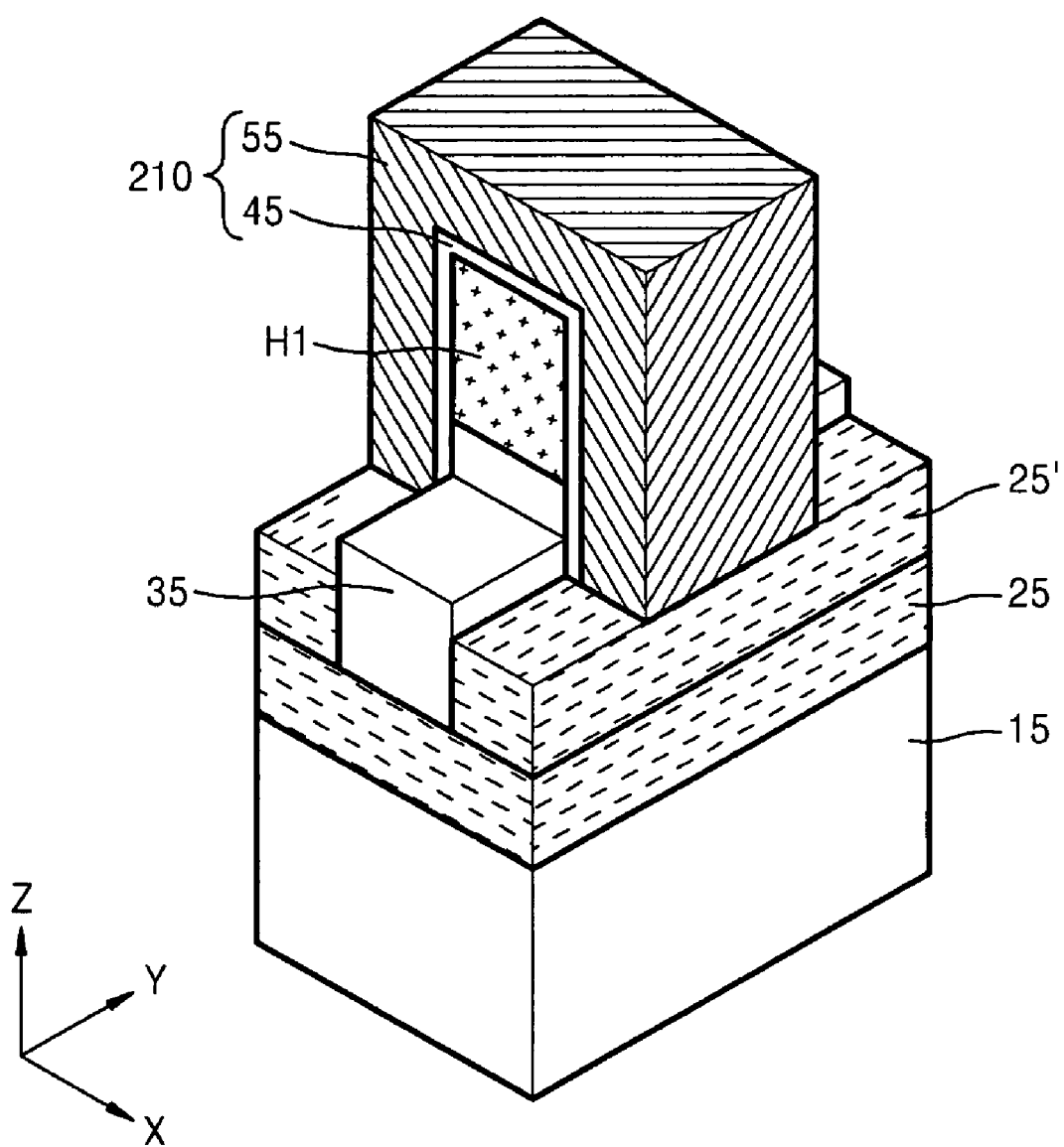

Referring to FIG. 8G, the second mask layer M2 may be removed. The charge reserving layer H1 on sides of the gate 210 and a portion of the second silicon layer 35 on both sides of the gate 210 under the charge reserving layer H1 may be etched using the gate 210 as an etch mask. Hydrogen chloride (HCl) gas and hydrogen fluoride (HF) gas may be used as etching gases.

Figure 8H:
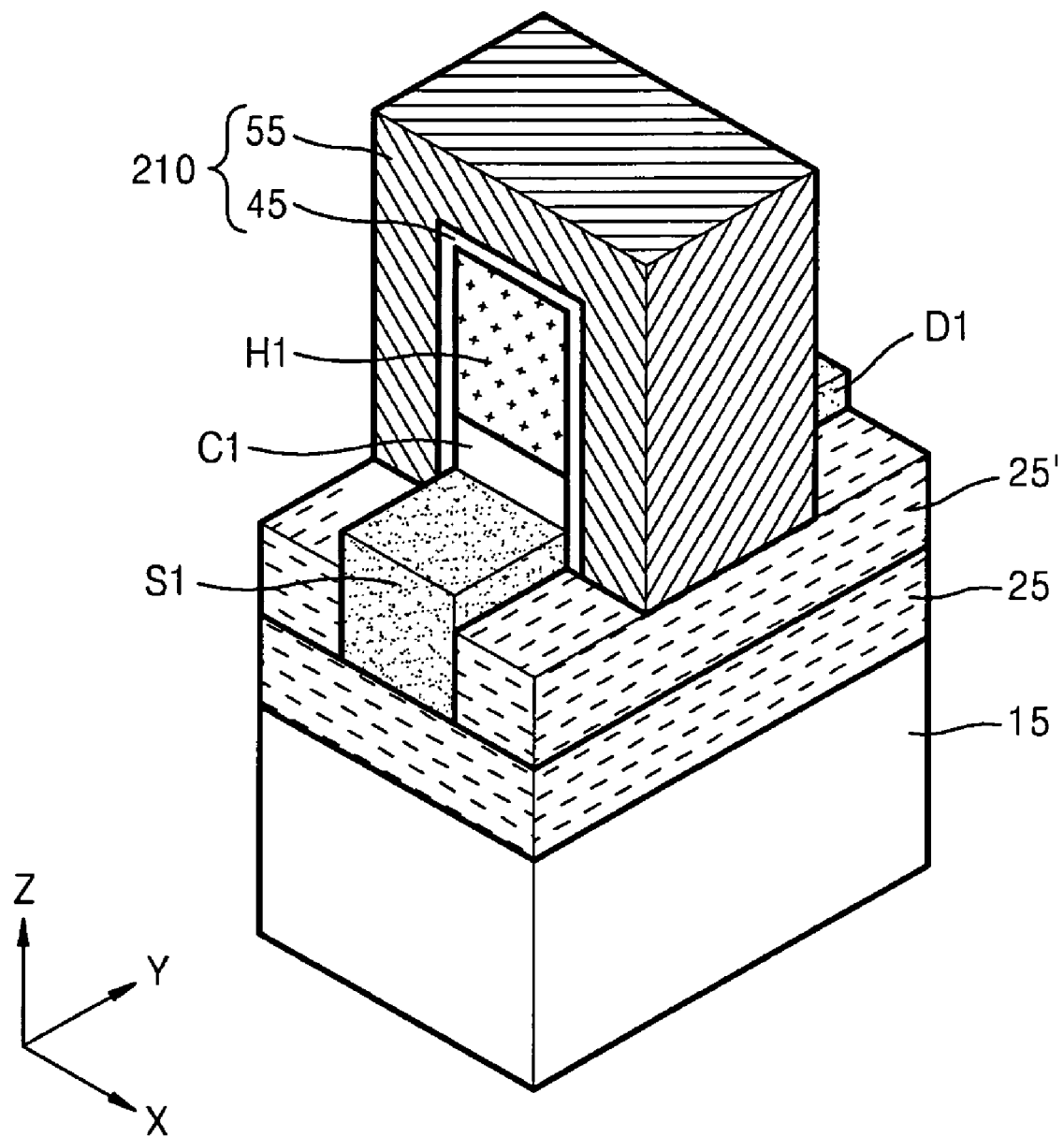

Referring to FIG. 8H, a source S1 and a drain D1 may be formed by highly doping an n-type dopant into etched portions of both exposed sides of the second silicon layer 35. The portion of the second silicon layer 35 between the source S1 and the drain D1 may be a channel layer C1. The channel layer C1 may protrude higher than the source S1 and the drain D1 in a Z-axis direction.

Although not shown, prior to forming the source S1 and the drain D1, an insulating spacer may be formed on the side walls of the gate 210, the charge reserving layer H1 and the exposed channel layer C1 in the Y-axis direction.

The method of manufacturing a capacitorless DRAM according to example embodiments may be modified in various ways. For example, in FIG. 8B, both sides of the charge reserving layer H1 and the entire second silicon layer 35 under the charge reserving layer H1 may be etched to obtain the structure depicted in FIG. 5.

A capacitorless DRAM according to example embodiments includes a charge reserving layer separated from the source and the drain, wherein the charge reserving layer has a higher data retention characteristic. In particular, the data retention time of the capacitorless DRAM according to example embodiments may be increased by increasing the height of the charge reserving layer.

The capacitorless DRAM according to example embodiments includes a channel layer protruded higher than the source and the drain (i.e., the capacitorless DRAM has a fin transistor structure). Degradation of the operating characteristics in the capacitorless DRAM according to example embodiments due to short channel effects may decrease, increasing the integration density of the capacitorless DRAM.

Because the capacitorless DRAM according to example embodiments has a single gate structure, the capacitorless DRAM may be more easily manufactured compared to a conventional capacitorless DRAM having a double gate structure.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A capacitorless DRAM, comprising:
   a source, a drain and a channel layer on a substrate, wherein the channel layer protrudes higher than the source and the drain;
   a charge reserving layer on the channel layer and separated from the source and the drain; and
   a gate that contacts the channel layer and the charge reserving layer.

2. The capacitorless DRAM of claim 1, wherein the gate is formed on two opposing sides of the channel layer, two opposing sides of the charge reserving layer and an upper surface of the charge reserving layer.

3. The capacitorless DRAM of claim 2, wherein the gate is formed on an upper portion of the two opposing sides of the channel layer.

4. The capacitorless DRAM of claim 3, further comprising an insulating layer on two opposing sides of a lower part of the channel layer.

5. The capacitorless DRAM of claim 1, wherein the charge reserving layer has a valence band higher than the channel layer.

6. The capacitorless DRAM of claim 1, wherein the substrate includes an insulating layer and a semiconductor layer formed on the insulating layer.

7. A method of operating a semiconductor device comprising:
   preparing the capacitorless DRAM according to claim 1; and
   applying a voltage to each of the source, the drain and the gate.

8. The method of claim 7, wherein the voltage is at least one selected from the group consisting of a data writing voltage, a data reading voltage and a data erasing voltage.

9. The method of claim 7, wherein the charge reserving layer has a valence band higher than that of the channel layer.

10. A capacitorless DRAM, comprising:
    a source, a drain and a channel layer on a substrate, wherein the channel layer protrudes higher than the source and the drain;
    a charge reserving layer on an upper surface of the channel layer and separated from the source and the drain; and
    a gate that contacts the channel layer and the charge reserving layer.

* * * * *